(12) United States Patent
Horng et al.

(10) Patent No.: US 6,640,888 B1
(45) Date of Patent: Nov. 4, 2003

(54) HEAT SINK

(75) Inventors: Alex Horng, Kaohsiung (TW);
Yin-Rong Hong, Kaohsiung (TW);
Ching-Sheng Hong, Kaohsiung (TW)

(73) Assignee: Sunonwealth Electric Machine Industry Co., Ltd. (TW)

( * ) Notice: Subject to any disclaimer, the term of this patent is extended or adjusted under 35 U.S.C. 154(b) by 0 days.

(21) Appl. No.: 10/270,542

(22) Filed: Oct. 16, 2002

(51) Int. Cl.[7] .................................................. F28F 7/00
(52) U.S. Cl. ...................... 165/185; 165/182; 165/80.3; 361/704; 361/697; 257/722
(58) Field of Search .................................. 165/185, 182, 165/80.3; 361/697, 711, 704; 29/890.032, 890.046; 257/706, 722

(56) References Cited

U.S. PATENT DOCUMENTS

| | | | | |
|---|---|---|---|---|
| 2,216,778 A | * | 10/1940 | Houdry | |
| 2,585,912 A | * | 2/1952 | Buschow et al. | |
| 3,189,087 A | * | 6/1965 | Parris | |
| 3,780,797 A | * | 12/1973 | Gebelius | |
| 4,928,756 A | * | 5/1990 | Shull et al. | |
| 5,509,465 A | * | 4/1996 | Lai | |
| 6,006,827 A | * | 12/1999 | Lu | |
| 6,382,307 B1 | * | 5/2002 | Wang et al. | |
| 6,435,266 B1 | * | 8/2002 | Wu | |
| 6,550,529 B1 | * | 4/2003 | Horng et al. | |

* cited by examiner

Primary Examiner—Terrell McKinnon
(74) Attorney, Agent, or Firm—Bacon & Thomas, PLLC

(57) ABSTRACT

A heat sink includes a plurality of spaced fins made of a thermally conductive material. Each of the fins has a through-hole surrounded by an annular wall. The annular wall is additionally provided with an axial slot which has a front end at a certain distance from a distal end of the annular wall and which extends to the related fin to form an aperture therein. A heat-conductive rod is inserted in the through-holes of the fins and fitted in the annular walls. Moreover, a bar is inserted in the apertures in the fins. The bar is made of low melting material so as to join the fins to the heat-conductive rod after the bar has been melt and then hardened.

5 Claims, 6 Drawing Sheets

HEAT SINK

BACKGROUND OF THE INVENTION

1. Field of the Invention

The present invention relates to a heat sink and, more particularly, to a heat sink in which a plurality of fins can be easily and securely connected to a heat-conductive rod.

2. Description of Related Art

Heat sinks are widely used for CPU (Central Processing Units). FIG. 1 shows a heat sink including a plurality of adjoined fins 90 made of a thermally conductive material. Each of the fins 90 is provided with a pair of angled edges 93 for engagement with the next fin 90 and with a through-hole 91 surrounded by an annular wall 92 for insertion of a heat-conductive rod 94 therein. The heat-conductive rod 94 has an end designed to be adhered to a heat source, for example, a CPU, so as to transmit heat produced by the heat source to the heat sink, where the heat can easily be dissipated.

In this conventional heat sink, the fins 90 are connected to the rod 94 by tightly fitting the same rod 94 in the through-holes 91 of all fins 90. The rod 94 must have a diameter slightly larger than that of the through-holes 91. If the diameter is much larger than necessary, the rod 94 is difficult to be inserted into the through-holes 91. On the other hand, if the diameter is less larger than necessary, neither the fins 90 can be securely connected to the rod 94 nor the annular walls 92 can be brought into a desired thermal contact with the rod 94.

FIG. 2 shows another heat sink that includes a plurality of spaced fins 8, each having a through-hole 81 surrounded by an annular wall 82 for insertion of a heat-conductive rod 86 therein. Each annular wall 82 here is additionally provided with a tapered portion 84 at a proximal end thereof and with an axial slot 83 which extends from a distal end of the annular wall 82 to the related fin 8, where the slot 83 forms an aperture 85 in which a bar 87 is inserted.

Although the axial slots 83 provides the annular walls 82 with a radial expansibility, which facilitates the insertion of both the rod 86 and the bar 87, it is much possible that the annular walls 82 may be expanded permanently and thus the fins 8 can not be securely connected to the rod 86.

OBJECTS OF THE INVENTION

The object of the present invention is to provide a heat sink in which a plurality of fins can be easily connected to a heat-conductive rod.

Another object of the present invention is to provide a heat sink in which the plurality of fins can be securely connected to the heat-conductive rod.

SUMMARY OF THE INVENTION

The present invention provides a heat sink comprising a plurality of spaced fins made of a thermally conductive material. Each of the fins has at least one through-hole surrounded by an annular wall. The annular wall is additionally provided with at least one axial slot which has a front end at a certain distance from the distal end of the annular wall and which extends to the related fin to form an aperture therein. A heat-conductive rod is inserted in the through-holes of the fins and fitted in the annular walls. Moreover, a bar is inserted in the apertures in the fins. The bar is made low melting material so as to join the fins to the heat-conductive rod after being melt and then hardened becoming hard again.

Other objects, advantages and novel features of this invention will become more apparent from the following detailed description when taken in conjunction with the accompanying drawings.

DETAILED DESCRIPTION OF THE PREFERRED EMBODIMENT

Figure 1:
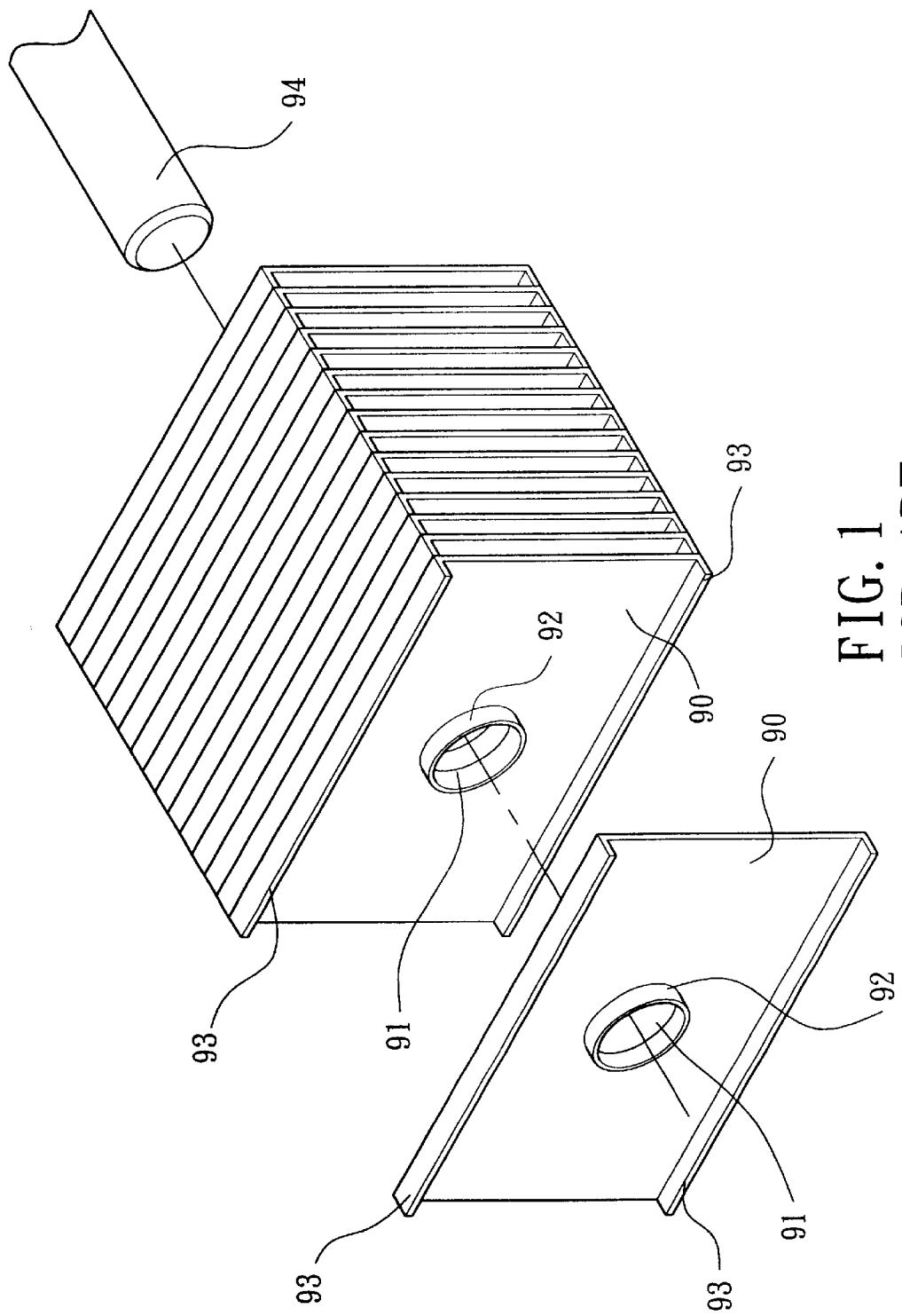
FIG. 1 is an exploded perspective view of a heat sink of a conventional type.
Figure 2:
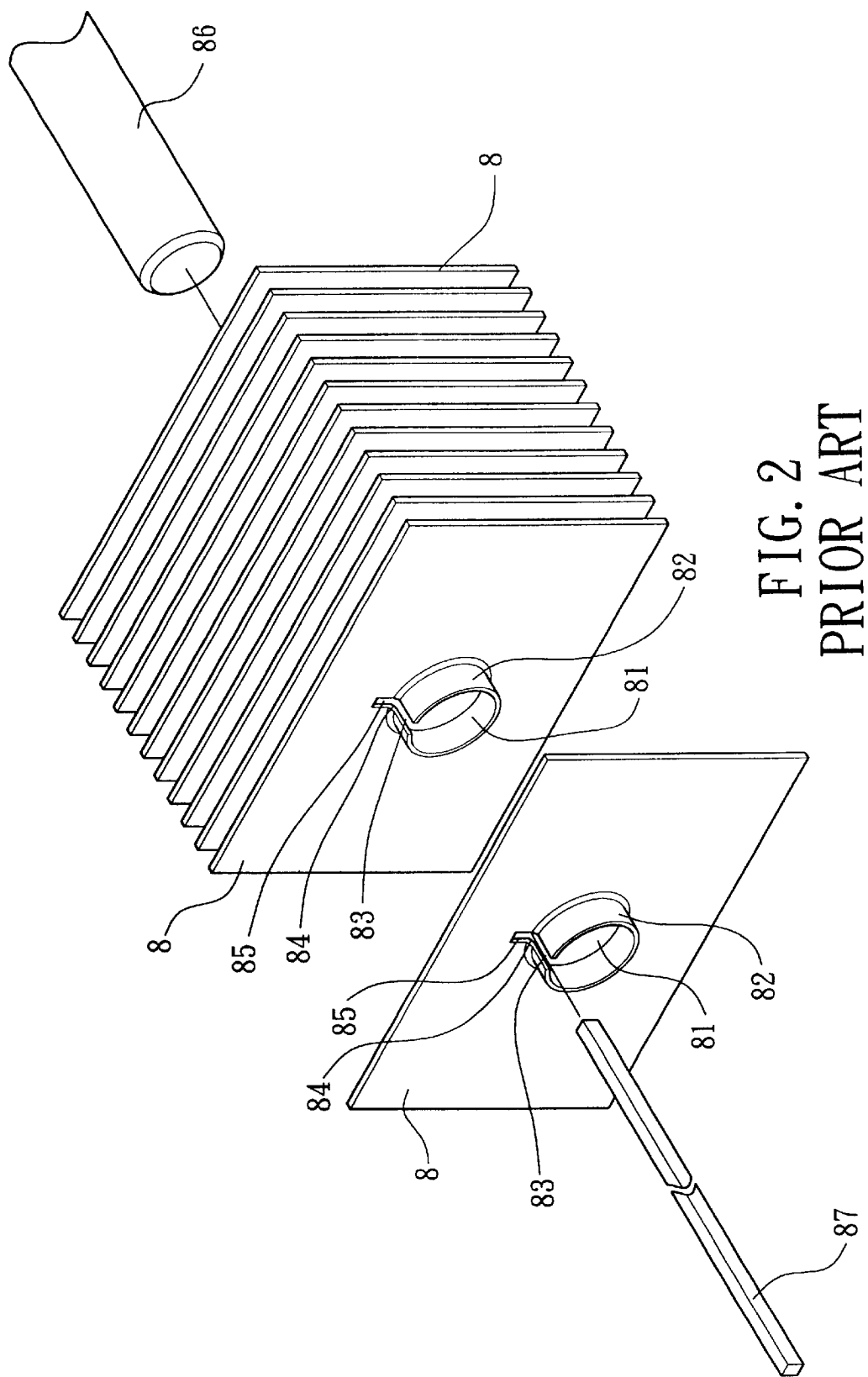
FIG. 2 is an exploded perspective view of a heat sink of another conventional type.
Figure 3:
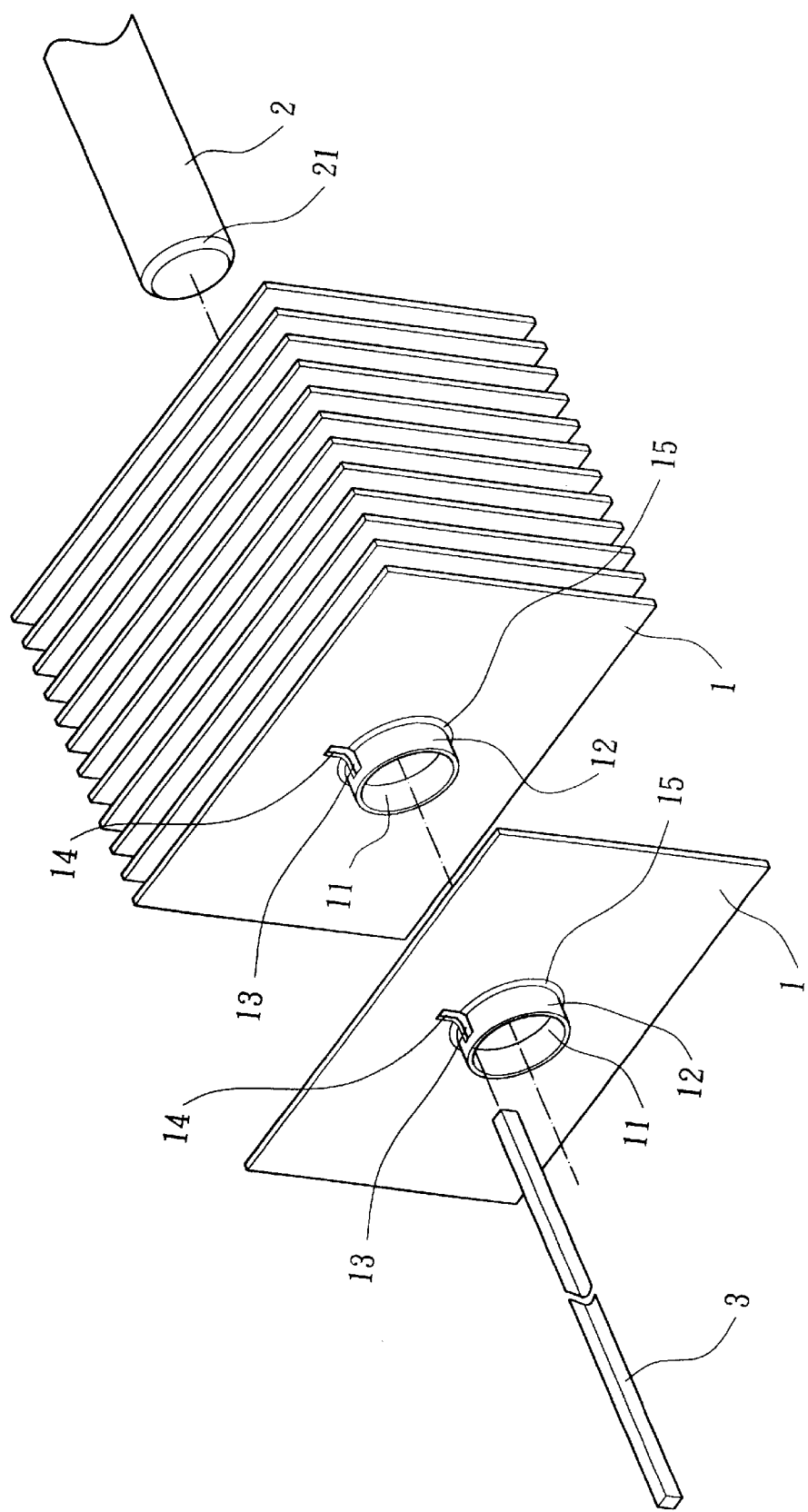
FIG. 3 is an exploded perspective view of a first preferred embodiment of a heat sink in accordance with the present invention.

Referring to FIG. 3, there is shown a first preferred embodiment of a heat sink in accordance with the present invention. The heat sink includes a plurality of spaced fins 1 made of a thermally conductive material, such as copper. Each of the fins 1 has a through-hole 11 surrounded by an annular wall 12 that projects from the related fin 1. The through-holes 11 of the fins 1 are aligned one with another, and a heat-conductive rod 2 is inserted into the aligned through-holes 11.

The rod 2, also made of a thermally conductive material, such as copper, has a constant section throughout its full length. In the illustrated embodiment, the rod 2 is configured as a round rod that has a diameter slightly larger than the inner diameter of each annular wall 12, so as to be tightly fitted in the annular walls 12 of the fins 1. Preferably, the rod 2 has a chamfered end 21 for leading the rod 2 into the through-holes 11 as well as the annular walls 12 of the fins 1.

In the inventive heat sink, each annular wall 12 is provided with an axial slot 13 which has a front end at a certain distance from the distal end of the annular wall 12 and which extends backward with respect to an axis to form an aperture 14 in the fin 1.

A bar 3 is inserted in these apertures 14 in the fins 1. The insertion of the bar 3 prevents the fins 1 from rotating about the round rod 2. More importantly, the bar 3 is made of low melting material, such as tin, so that it can easily be melted and joins all of the fins 1 to the rod 2 after it is hardened.

Figure 5:
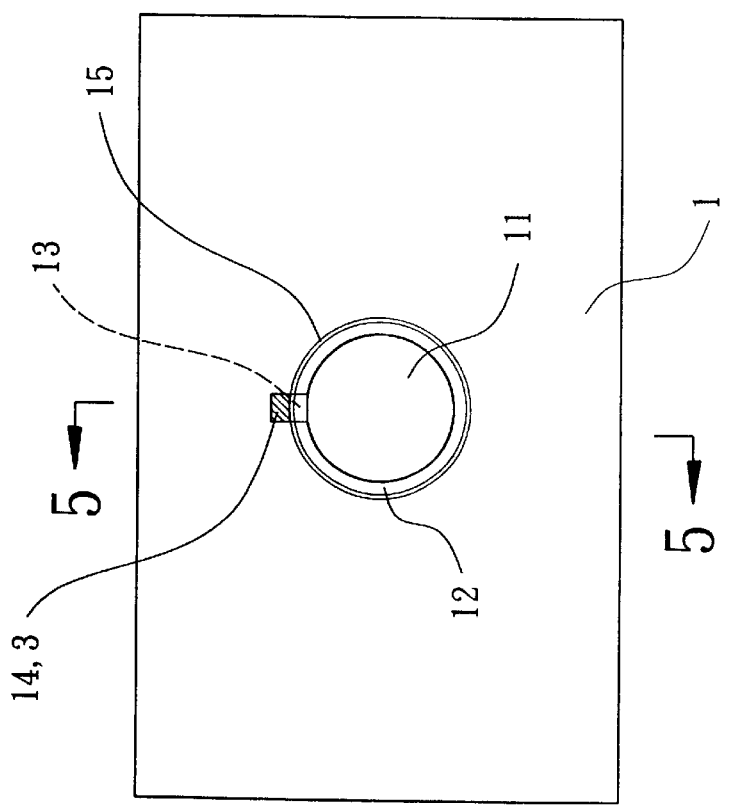
FIG. 5 is a cross-sectional side view taken along lines 5—5 in FIG. 4.

In addition to the slot 13, each annular wall 12 is further provided with a tapered portion 15 at a proximal end thereof for engaging with the distal end of an annular wall 12 of the next fin 1, as best shown in FIG. 5, thereby spacing the fins 1 one from another.

Figure 4:
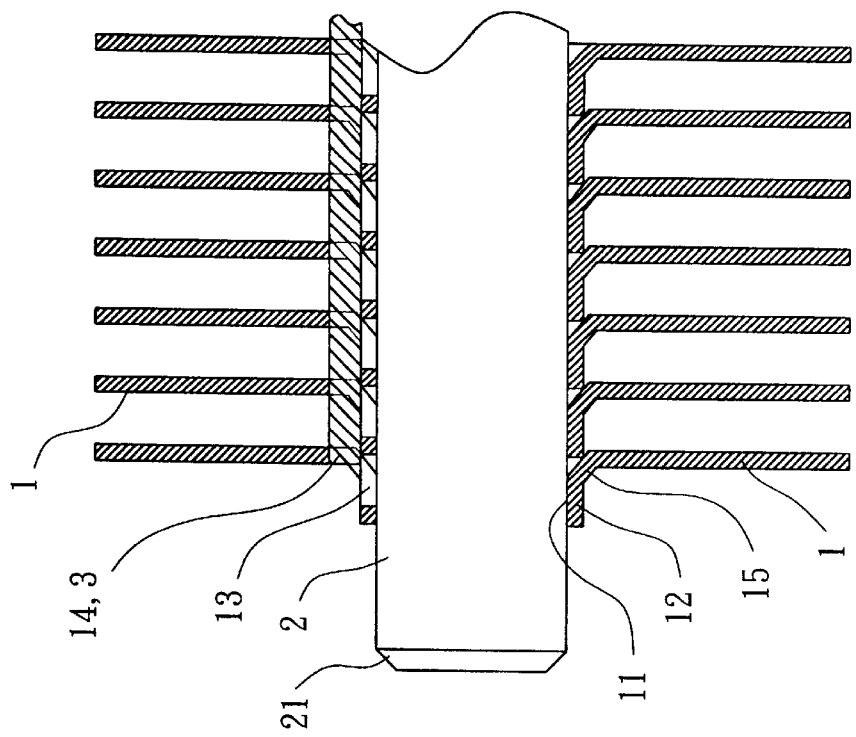
FIG. 4 is a front view of the inventive heat sink shown in FIG. 3.

Referring to FIGS. 4 and 5, the heat sink can be assembled by inserting the heat-conductive rod 2 into the respective through-holes 11 of the fins 1 while the through-holes 11 are aligned one with another. Provided with the axial slots 13, each of the annular walls 12 has a slight radial expansibility, which facilitates the insertion of the rod 2 into the annular walls 12 or the through-holes 11.

The radial expansibility also facilitates the movement of the fins 1 along the heat-conductive rod 2 while initially assembling. These fins 1 are moved till the annular wall 12 of each fin 1 is engaged at its distal end with the tapered portion 15 of the next fin 1, when all of the fins 1 are spaced equidistantly one from another.

The fins 1 are then turned respectively about the rod 2 in such a way that the apertures 14 are aligned with one another for the insertion of the bar 3 therein. This bar 3 of the low-melted material can prevent any possible rotation of the fins 1 about the rod 2 and, after being melted and then hardened, can join all of the fins 1 securely to the rod 2.

Figure 6:
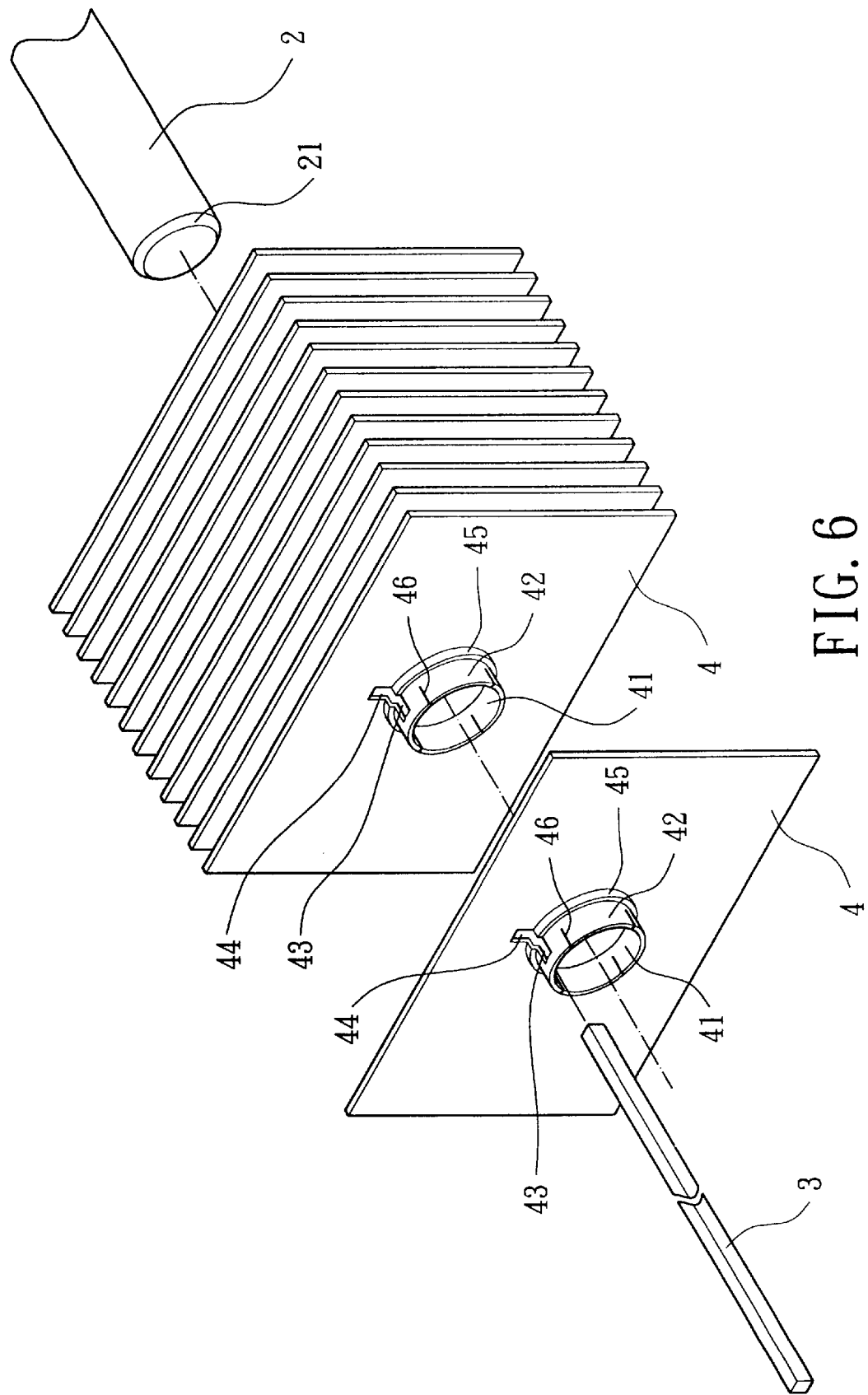
FIG. 6 is an exploded perspective view of a second preferred embodiment of the inventive heat sink.

Referring to FIG. 6, a second preferred embodiment of the inventive heat sink is shown now. Each fin 4 here is also made of a thermally conductive material, and has a through-hole 41 surrounded by an annular wall 42 for insertion of a heat-conductive rod 2 therein.

Again, each annular wall 42 is provided with an axial slot 43 which has a front end at a certain distance from the distal end of the annular wall 42 and which extends backward with respect to an axis to form an aperture 44 in the fin 4. These apertures 44 are also formed for insertion of an easily-melted bar 3 therein.

In this embodiment, however, each of annular walls 42 is provided with a stepped portion 45 at a proximal end thereof for engaging with the distal end of an annular wall 42 of the next fin 4 and, additionally, with a plurality of axial splits 46 that extend to the distal end of the annular wall 42. Each of the axial splits 46 preferably has a length no longer than an axial length of the stepped portion 45.

Figure 8:
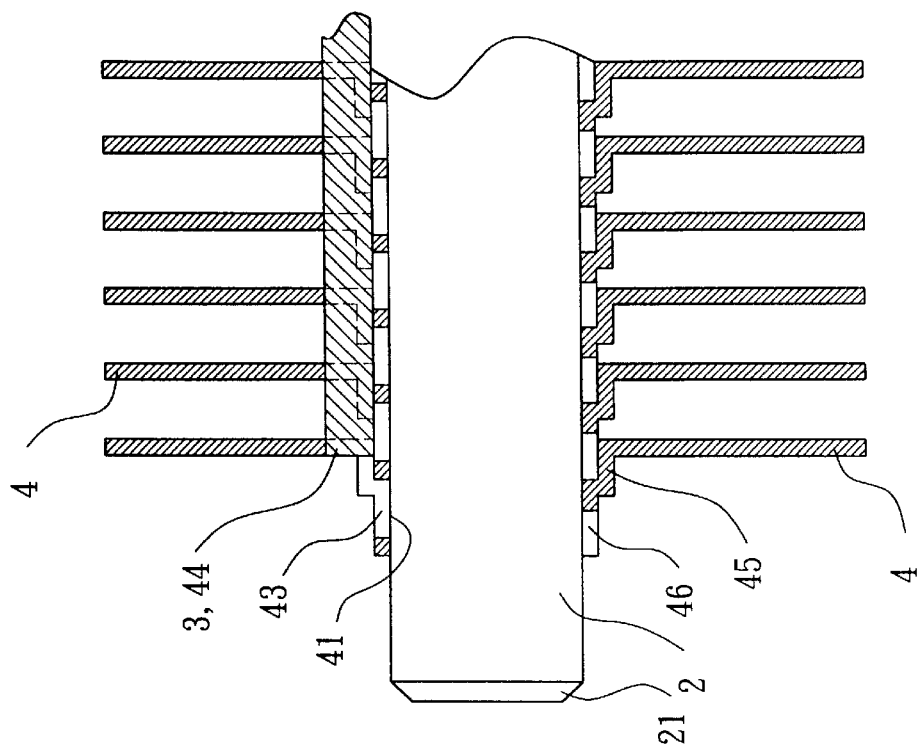
FIG. 8 is a cross-sectional side view taken along lines 8—8 in FIG. 7.
Figure 7:
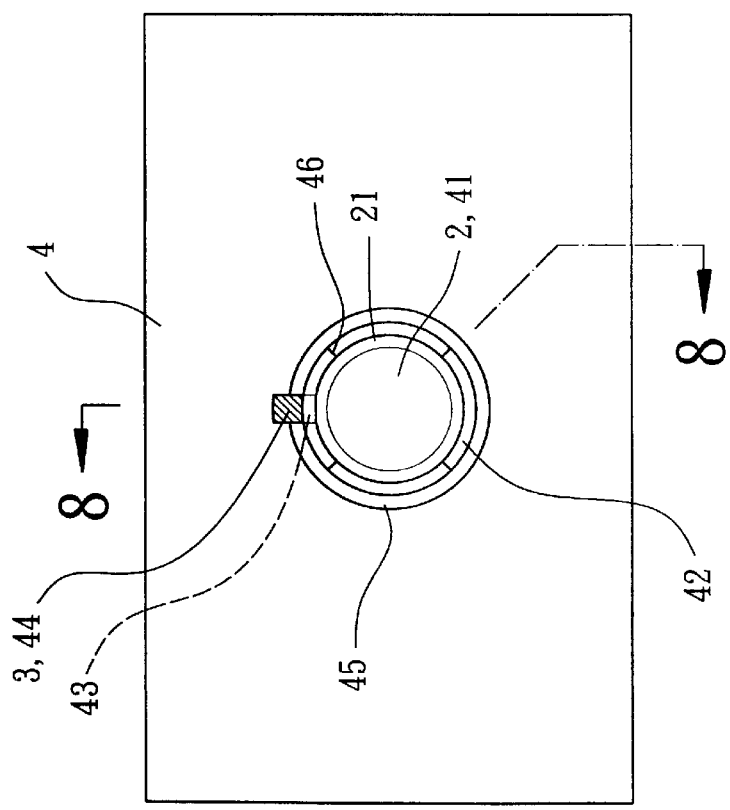
FIG. 7 is a front view of the inventive heat sink shown in FIG. 6.

Referring to FIGS. 7 and 8, the heat sink here can be assembled by inserting the heat-conductive rod 2 into the through-holes 41 of the fins 4 while the through-holes 41 are aligned one with another. As a result of the axial slot 43 and particularly the splits 46, each annular wall 42 now may more easily be expanded in its radial direction during the process when the rod 2 is being inserted into the annular walls 42 or the through-holes 41 of the fins 4.

After the insertion is completed, each annular wall 42 recovers and tightly presses against the rod 2, thus securely connecting the fins 4 to the same rod 2. The fins 4 are now spaced equidistantly one from another by engaging the distal end of each annular wall 42 with the stepped portion 45 of the next fin 4.

From the foregoing, it is apparent that this invention has the advantage of enabling the fins 1 or 4 to be easily and securely connected to the thermal conductive rod 2.

While the principles of this invention have been disclosed in connection with specific embodiments, it should be understood by those skilled in the art that these descriptions are not intended to limit the scope of the invention, and that any modification and variation without departing the spirit of the invention is intended to be covered by the scope of this invention defined only by the appended claims.

What is claimed is:

1. A heat sink comprising:
    a plurality of spaced fins made of a thermally conductive material, each of said fins having at least one through-hole surrounded by an annular wall projecting from said fin, said through-holes being aligned one with another;
    a heat-conductive rod inserted in said aligned through-holes and fitted in said annular walls of said fins;
    said annular wall being provided with at least one axial slot having a front end at a certain distance from a distal end of said annular wall, said axial slot extending to said fin to form an aperture in said fin; and
    a bar inserted in said apertures in said fins, said bar being made of low melting material so as to join said fins to said heat-conductive rod after being melted and then hardened.

2. The heat sink as claimed in claim 1, wherein said annular wall is provided with a tapered portion at a proximal end thereof for engaging with an annular wall of the next fin.

3. The heat sink as claimed in claim 1, wherein said annular wall is provided with a stepped portion at a proximal end thereof for engaging with an annular wall of the next fin.

4. The heat sink as claimed in claim 3, wherein said annular wall is further provided with a plurality of axial splits extending to said distal end thereof, and wherein each of said axial splits has a length no longer than an axial length of said stepped portion.

5. The heat sink as claimed in claim 1, wherein said heat-conductive rod has a chamfered end for leading said rod into said through-holes of said fins.

* * * * *